United States Patent
Wei et al.

(10) Patent No.: US 9,048,246 B2
(45) Date of Patent: Jun. 2, 2015

(54) DIE SEAL RING AND METHOD OF FORMING THE SAME

(71) Applicant: UNITED MICROELECTRONICS CORP., Hsin-Chu (TW)

(72) Inventors: Ming-Te Wei, Changhua County (TW); Po-Chao Tsao, New Taipei (TW); Ching-Li Yang, Ping-Tung Hsien (TW); Chien-Yang Chen, Kaohsiung (TW); Hui-Ling Chen, Kaohsiung (TW); Guan-Kai Huang, Tainan (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 121 days.

(21) Appl. No.: 13/921,174

(22) Filed: Jun. 18, 2013

(65) Prior Publication Data

US 2014/0367835 A1   Dec. 18, 2014

(51) Int. Cl.
| | |
|---|---|
| H01L 23/00 | (2006.01) |
| H01L 21/768 | (2006.01) |
| H01L 21/78 | (2006.01) |
| H01L 23/58 | (2006.01) |

(52) U.S. Cl.
CPC ........ *H01L 23/562* (2013.01); *H01L 21/76838* (2013.01); *H01L 21/78* (2013.01); *H01L 23/585* (2013.01)

(58) Field of Classification Search
CPC .............................. H01L 23/562; H01L 23/585
See application file for complete search history.

(56) References Cited

U.S. PATENT DOCUMENTS

| | | |
|---|---|---|
| 6,043,138 A | 3/2000 | Ibok |
| 6,492,216 B1 | 12/2002 | Yeo |
| 6,921,963 B2 | 7/2005 | Krivokapic |
| 7,087,477 B2 | 8/2006 | Fried |
| 7,091,551 B1 | 8/2006 | Anderson |
| 7,247,887 B2 | 7/2007 | King |
| 7,250,658 B2 | 7/2007 | Doris |
| 7,309,626 B2 | 12/2007 | Ieong |
| 7,352,034 B2 | 4/2008 | Booth, Jr. |
| 7,470,570 B2 | 12/2008 | Beintner |
| 7,531,437 B2 | 5/2009 | Brask |
| 7,569,857 B2 | 8/2009 | Simon |
| 2004/0195624 A1 | 10/2004 | Liu |
| 2005/0051825 A1 | 3/2005 | Fujiwara |
| 2006/0099830 A1 | 5/2006 | Walther |
| 2006/0286729 A1 | 12/2006 | Kavalieros |
| 2007/0105370 A1* | 5/2007 | Kinderknecht et al. ...... 438/637 |
| 2007/0108528 A1 | 5/2007 | Anderson |
| 2007/0158756 A1 | 7/2007 | Dreeskornfeld |
| 2008/0157208 A1 | 7/2008 | Fischer |
| 2009/0124097 A1 | 5/2009 | Cheng |
| 2009/0242964 A1 | 10/2009 | Akil |
| 2009/0269916 A1 | 10/2009 | Kang |

(Continued)

*Primary Examiner* — Joseph C Nicely
(74) *Attorney, Agent, or Firm* — Winston Hsu; Scott Margo (57) ABSTRACT

A die seal ring is provided. The die seal ring includes a substrate and a first layer extruding from the substrate. The first layer has a first fin ring structure and a layout of the first fin ring structure has a stamp-like shape. In addition, a method for forming a die seal ring is provided. A substrate having an active region is provided. A patterned sacrificial layer is formed on the substrate. A spacer is formed on the sidewall of the patterned sacrificial layer. The patterned sacrificial layer is removed. The substrate is patterned by using the spacer as a mask, thereby simultaneously forming at least a fin structure of a Fin-FET and a first layer of the die seal ring.

19 Claims, 9 Drawing Sheets

(56) References Cited

U.S. PATENT DOCUMENTS

| | | | |
|---|---|---|---|
| 2010/0025824 A1* | 2/2010 | Chen et al. | 257/620 |
| 2010/0048027 A1 | 2/2010 | Cheng | |
| 2010/0072553 A1 | 3/2010 | Xu | |
| 2010/0144121 A1 | 6/2010 | Chang | |
| 2010/0167506 A1 | 7/2010 | Lin | |
| 2010/0207237 A1* | 8/2010 | Yao et al. | 257/508 |
| 2012/0175728 A1* | 7/2012 | Yang et al. | 257/508 |
| 2012/0223445 A1* | 9/2012 | Lehr | 257/797 |
| 2014/0084444 A1* | 3/2014 | Lin | 257/698 |
| 2014/0084445 A1* | 3/2014 | Lin | 257/698 |
| 2014/0124889 A1* | 5/2014 | Qian et al. | 257/448 |
| 2014/0131850 A1* | 5/2014 | Chen et al. | 257/684 |
| 2014/0220735 A1* | 8/2014 | Teng et al. | 438/107 |

* cited by examiner

DIE SEAL RING AND METHOD OF FORMING THE SAME

BACKGROUND OF THE INVENTION

1. Field of the Invention

The present invention relates to a die seal ring in a chip, and more particularly, to a die seal ring having a stamp structure.

2. Description of the Prior Art

In modern society, the micro-processor system comprised of integrated circuits (IC) is a ubiquitous device, being utilized in such diverse fields as automatic control electronics, mobile communication devices and personal computers. With the development of technology and the increasingly imaginative applications of electrical products, the IC device is becoming smaller, more delicate and more diversified.

As is well known in the art, an IC device is produced from dies that are fabricated by conventional semiconductor manufacturing processes. The process to manufacture a die starts with a wafer: first, different regions are marked on the wafer; second, conventional semiconductor manufacture processes such as deposition, photolithography, etching or planarization are used to form needed circuit trace(s); then, each region of the wafer is separated to form a die and then packaged to form a chip.

Figure 1:
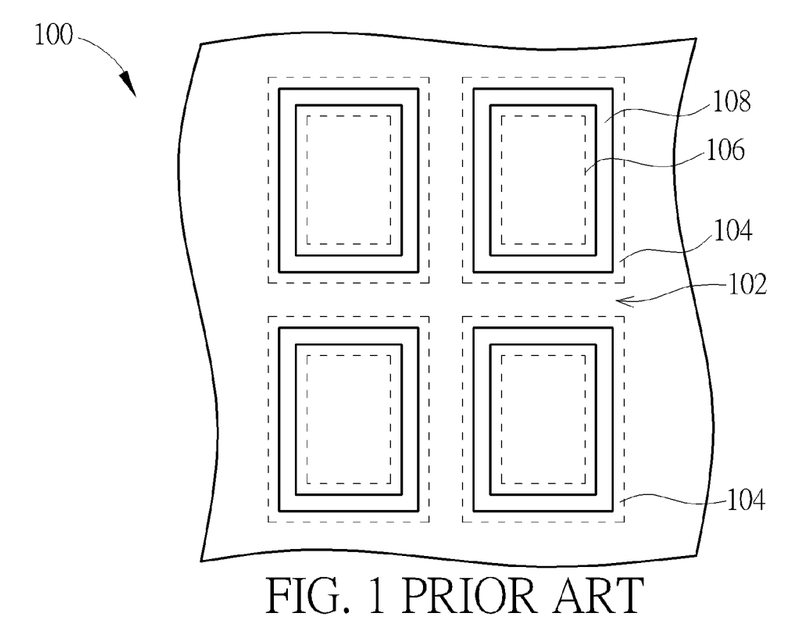
FIG. 1 illustrates a top view of a wafer which is ready to be diced according to the prior art.

A die seal ring is designed on the chip to protect the active regions in the chip. Please refer to FIG. 1, FIG. 1 illustrates a top view of a wafer which is ready to be diced according to the prior art. As shown in FIG. 1, a wafer 100 is provided, in which a scribe line region 102 and a plurality of die regions 104 are defined thereon. The scribe line region 102 will be subjected to a dicing process by a dicing tool so that each die region 104 of the wafer 100 becomes an individual chip. As shown in FIG. 1, each die region 104 has an active region 106 and a die seal ring 108. The die seal ring 108 completely encompasses the active region 106 such that it could be used as a blocking wall for protecting the active region 106 from external stress while the wafer is diced.

However, because the line width of the devices are becoming shrinking and width the die seal ring 108 is becoming less as well. The die seal ring 108 can no longer give good protection for the active region 106 and is easy to collapse during chemical mechanical polishing (CMP) for FINFET process. Therefore, a strong and sufficient protecting structure of the die seal ring is always in need.

SUMMARY OF THE INVENTION

The present invention therefore provides a die seal ring having novel structure to resolve the above problems.

According to one embodiment, a die seal ring is provided. The die seal ring includes a substrate and a first layer extrudes from the substrate. The first layer has a first fin ring structure and a layout of the first fin ring structure has a stamp-like shape.

According to another embodiment, a method for forming a die seal ring is provided. A substrate having an active region is provided. A patterned sacrificial layer is formed on the substrate. A spacer is formed on the sidewall of the patterned sacrificial layer. The patterned sacrificial layer is removed. The substrate is patterned by using the spacer as a mask, thereby simultaneously forming at least a fin structure of a Fin-FET and a first layer of the die seal ring.

The present invention provides a die seal ring and a method of forming the same. The die seal ring includes a first layer in which the layout of thereof has a stamp like structure. In this way, the die seal ring can be more rigid and give a strong protection for the encompassed active region.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

Please see

DETAILED DESCRIPTION

To provide a better understanding of the presented invention, preferred embodiments will be made in detail. The preferred embodiments of the present invention are illustrated in the accompanying drawings with numbered elements.

Figure 2:
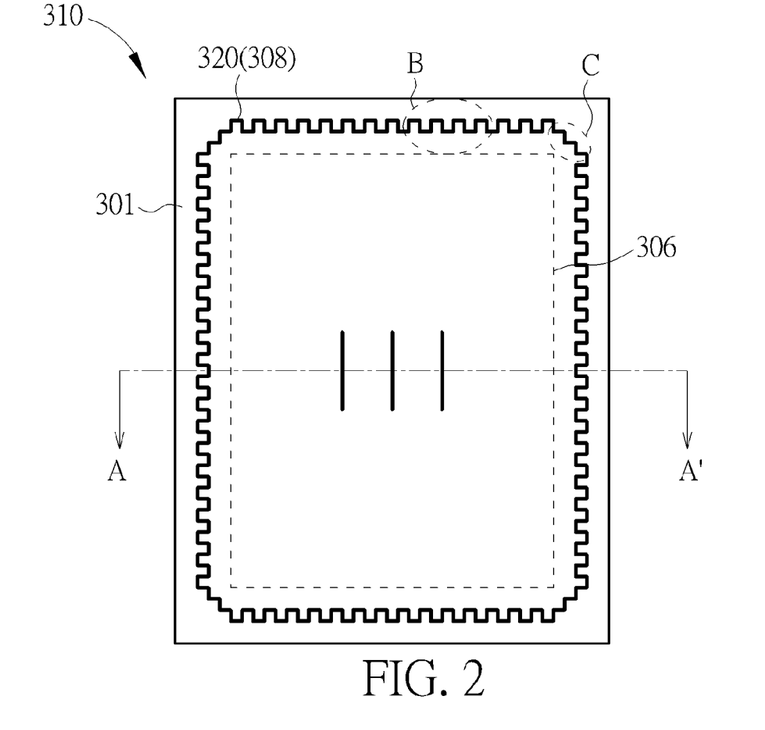
FIG. 2 and FIG. 3 show schematic diagrams of the die seal ring in a chip according to one embodiment of the present invention.
Figure 3:
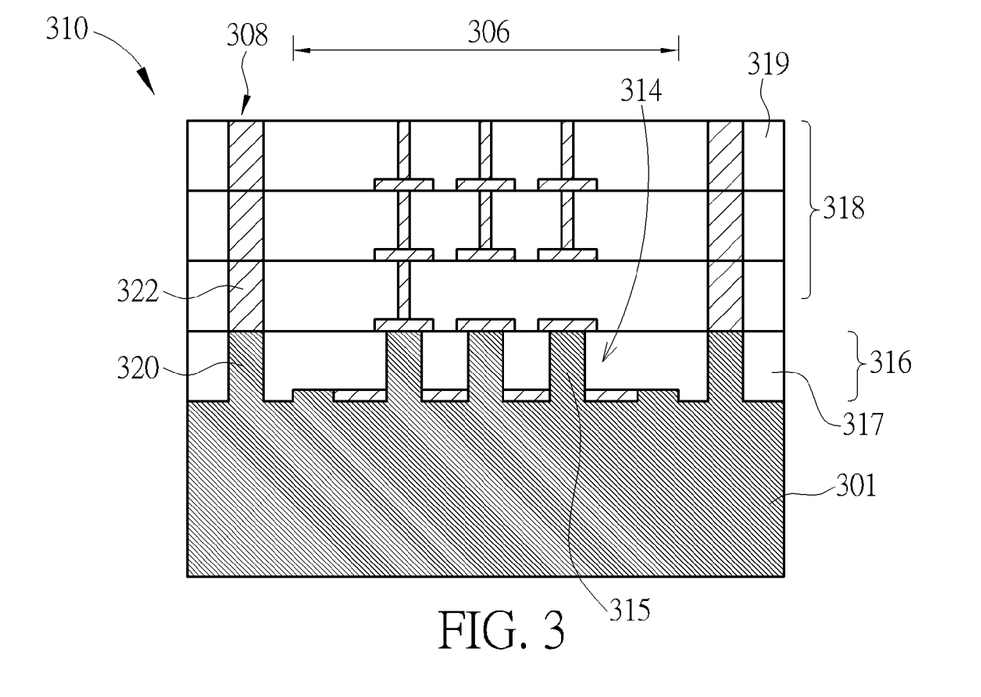

Please refer to FIG. 2 and FIG. 3, which show schematic diagrams of the die seal ring in a chip according to one embodiment of the present invention, wherein FIG. 3 is a cross-sectional view taken along line AA' in FIG. 2. As shown in FIG. 2, a die seal ring 308 is in a chip 310 and completely encompasses an active region 306. Preferably, the die seal ring 308 is disposed at the most periphery area of the chip 310.

As shown in FIG. 3, the chip 310 in the present invention includes a substrate 301 and an intra-dielectric (ILD) layer 317, a plurality of inter-metal dielectric (IMD) layers 319 disposed on the substrate 301. In the active region 306, a plurality of active components such as Fin-FET 314 having a fin structure 315 are disposed in the ILD layer 316, while a metal interconnection system 318, which electrically connected to the Fin-FET 314, is disposed in the IMD layers 319. The die seal ring 308 is disposed at the peripheral of the active region 306 and completely surrounds the active region 306. The die seal ring 308 includes a plurality of layers, which are disposed in sequence on the substrate 301, for example, a first layer 320 which is disposed in the ILD layer 317, a second layer 322 which is disposed in the IMD layer 319. In one embodiment, the first layer 320 can be formed simultaneously with the fin structure 315 of the Fin-FET 314 by a fin forming process, so the first layer 320 and the fin structure 315 have the same semiconductor material such as silicon or germanium. The second layer 322 can be formed simultaneously with the metal interconnection system 318 by a metal interconnection forming method, so the second layer 322 and the metal interconnection system 318 have the same material such as metal. It is understood that besides the first layer 320 and the second layer 322, the die seal ring 308 may include other layer structures disposed on the second layer 322. Preferably, the first layer 320, the second layer 322 and the above layer structures directly contact each, from the substrate 301 to a top surface of the chip 310, to form a solid structure so as to give sufficient support for the chip 310. In one embodiment, the first layer 320 of the fin structure 308 has a dopant concentration and is conductive. Accordingly, the first layer 320 and the metal second layer 322 can be electrically connected to each other so the die seal ring 308 can reduce the electromagnetic interference (EMI) form the active region 306.

Please see again to FIG. 2. In order to have stronger supporting ability, the first layer 320 of the die seal ring 308 has a first fin ring structure 320A, wherein a layout of the first fin ring structure 320A has a closed stamp-like shape. It is understood that FIG. 2 shows the first fin structure 320A is a stamp-like rectangle, however, in another embodiment, the first fin structure can be any stamp-like polygon or circle.

Figure 4:
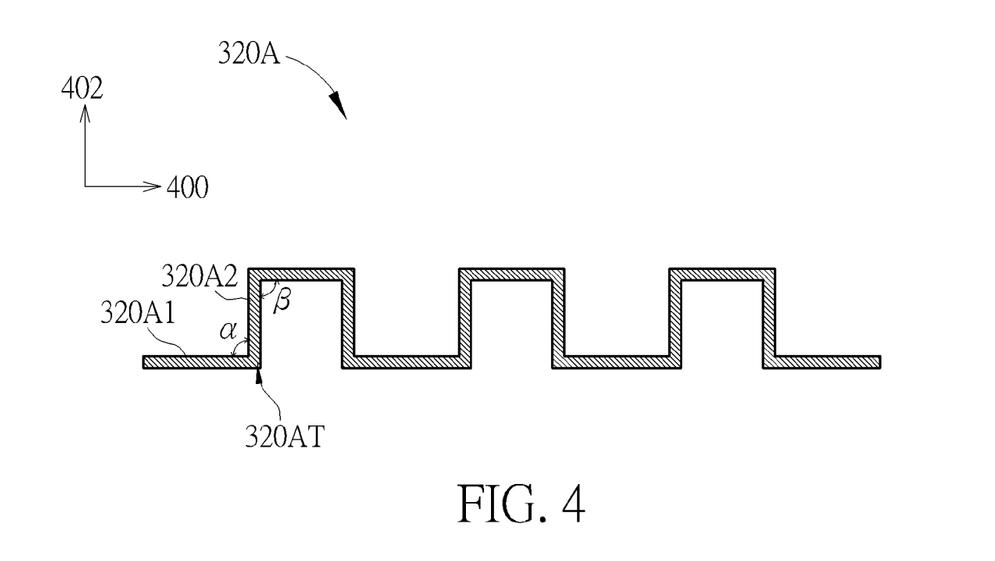
FIG. 4 to FIG. 12 show schematic diagrams of the die seal ring according to different embodiments of the present invention.
Figure 5:
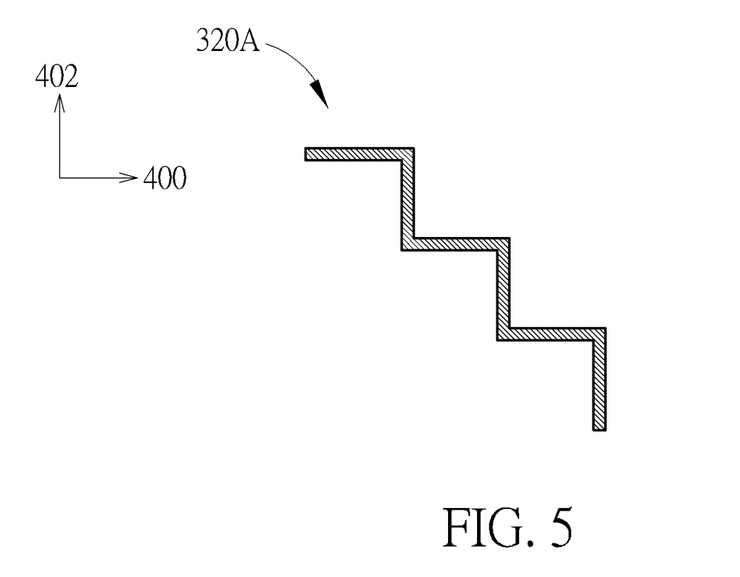

For the detail description of the stamp-like shape, please see FIG. 4, which shows an enlarged picture of region B in FIG. 2. As shown in FIG. 4, the first fin ring structure 320A is composed of a plurality of first lines 320A1 and a plurality of second lines 320A2, which are connected alternatively with each other. A turning point 320AT is disposed at the intersection of the first line 320A1 and the second line 320A2. In one embodiment, the first lines 320A1 are parallel to the first direction 400 and the second lines 320A2 are parallel to a second direction 402, wherein the first direction 400 and the second direction 402 are substantially perpendicular to each other. The angle $\alpha$ and the angle $\beta$ are both a right angle. As such, the first fin ring structure 320A has a "saw-tooth" structure. By doing this, the first line 320A1 can provide a protection strength along the first direction 400 and the second line 320A2 can provide a protection strength along the second direction 402. Comparing to conventional arts that can only provide one direction protection, the first layer 308 in the present invention is more rigid. The conventional arts for thin fin process is not strong enough to against stress caused crack, break or peeling during process. Similarly, as shown in FIG. 5 which shows an enlarged picture of region C in FIG. 2, the first fin ring structure 320A will turn at the corner of the chip 310, for example, turn to about 45 degrees to the right-down side. But the first fin ring structure 320A still has the "saw-tooth" structure.

Figure 6:
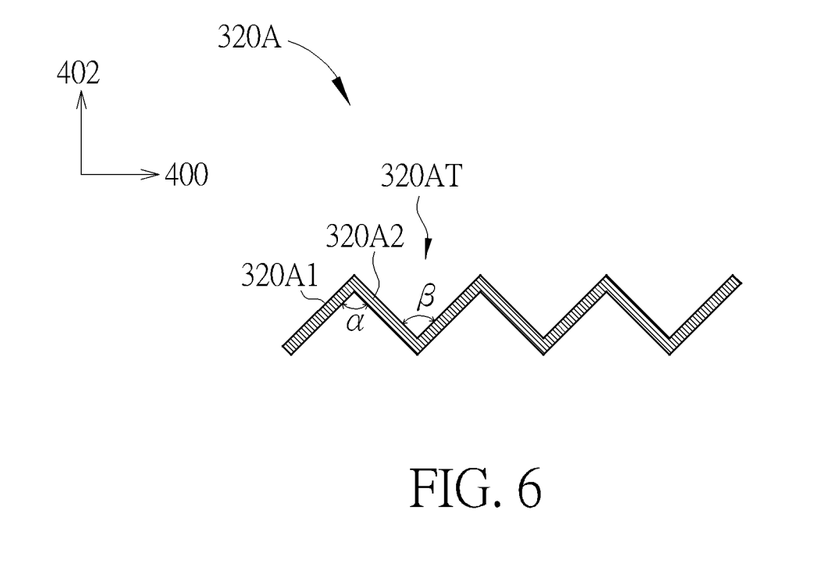

The first fin ring structure 320A in the present invention has various embodiments. The following embodiments show an enlarged picture corresponding to region B in FIG. 2. Please see FIG. 6, which shows a schematic diagram of the first layer of the die seal ring according to another embodiment of the present invention. As shown in FIG. 6, the first fin ring structure 320A is composed of the first lines 320A1 and the second lines 320A2. In the present embodiment, the first lines 320A1 are parallel to each other but are not parallel to the first direction 400 or the second direction 402. The second lines 320A2 are parallel to each other but are not parallel to the first direction 400 or the second direction 402. As such, the first fin ring structure 320A has a "zigzag" structure. Since the zigzag structure extends along the first direction 400, the angle $\alpha$ plus the angle $\beta$ is about 180 degrees.

Figure 7:
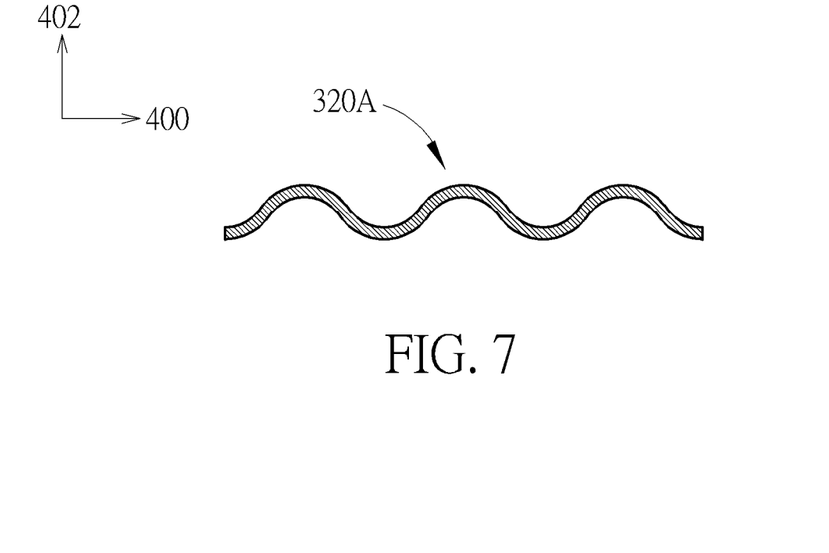

Please see FIG. 7, which shows a schematic diagram of the first layer of the die seal ring according to another embodiment of the present invention. As shown in FIG. 7, the first fin ring structure 320A is not composed of straight lines but of curved lines, thereby forming a "serpent" structure. Since the serpent rim extends along the first direction 400 and wiggles left and right along the second direction 402, it can still provides good supporting ability.

Figure 8:
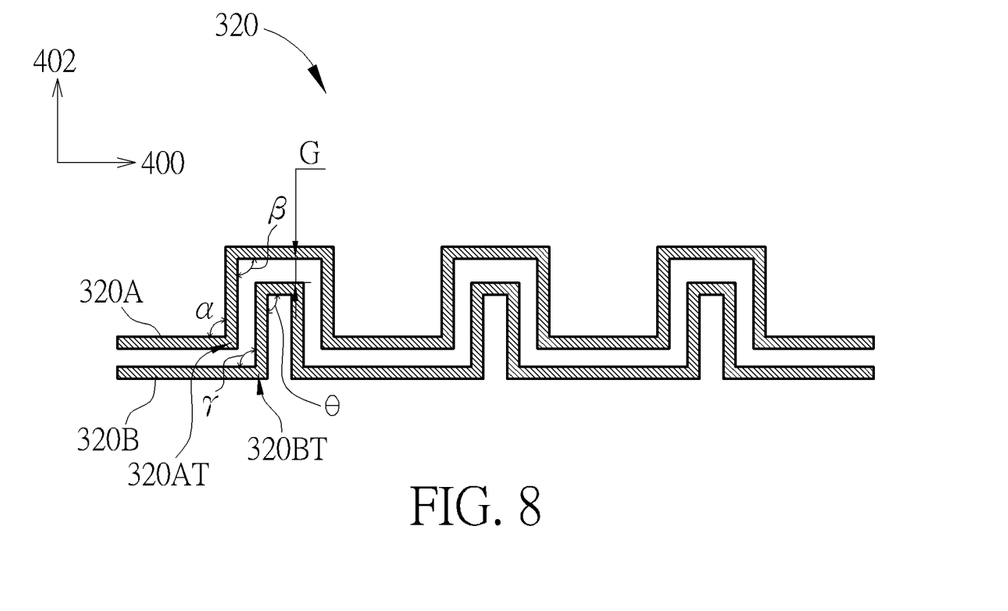

Besides the first fin ring structure 320A, the first layer 320 further comprises a second fin ring structure 320B. The second fin ring structure 320B can have the similar embodiment as the first fin ring structure 320A, or can have different embodiment as the first fin ring structure 320A. Please see FIG. 8, which shows a schematic diagram of the first layer of the die seal ring according to another embodiment of the present invention. As shown in FIG. 8, the first fin ring structure 320A has similar embodiment with that in FIG. 4, and the second fin ring structure 320B is conformal to the first fin ring structure 320A. The term "conformal" means that each turning point in the first fin ring structure 320A (the turning point 320AT for example) is corresponding to each turning point in the second fin ring structure 320B (the turning point 320BT for example). In this manner, the angle $\alpha$ is substantially equal to the angle $\gamma$, and the angle $\beta$ is substantially equal to the angle $\theta$. A gap G is disposed between the first fin ring structure 320A and the second fin ring structure 320B.

Figure 9:
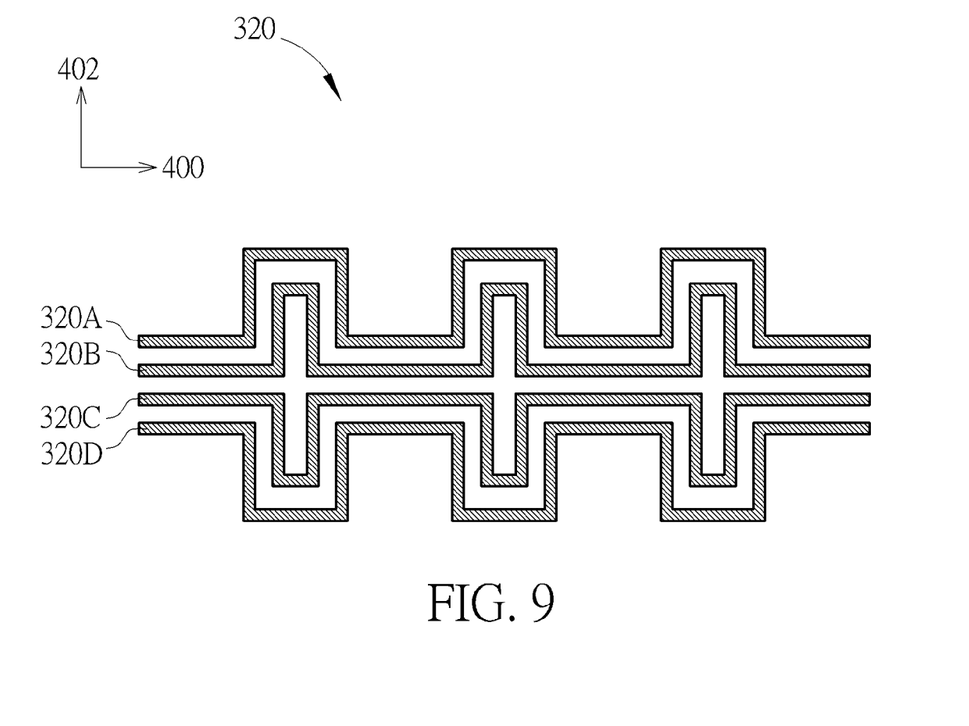

Please see FIG. 9, which shows a schematic diagram of the first layer of the die seal ring according to another embodiment of the present invention. As shown in FIG. 9, the first layer 320 has a first fin ring structure 320A, a second fin ring structure 320B, a third fin ring structure 320C and a fourth fin ring structure 320D. The first fin ring structure 320A has similar embodiment with that in FIG. 4, and the second fin ring structure 320B is conformal to the first fin ring structure 320A. The third fin ring structure 320C is conformal to the fourth fin ring structure 320D. The first fin ring structure 320A, the second fin ring structure 320B are symmetrical with the third fin ring structure 320C and the fourth fin ring structure 320D about the first direction 400.

Figure 10:
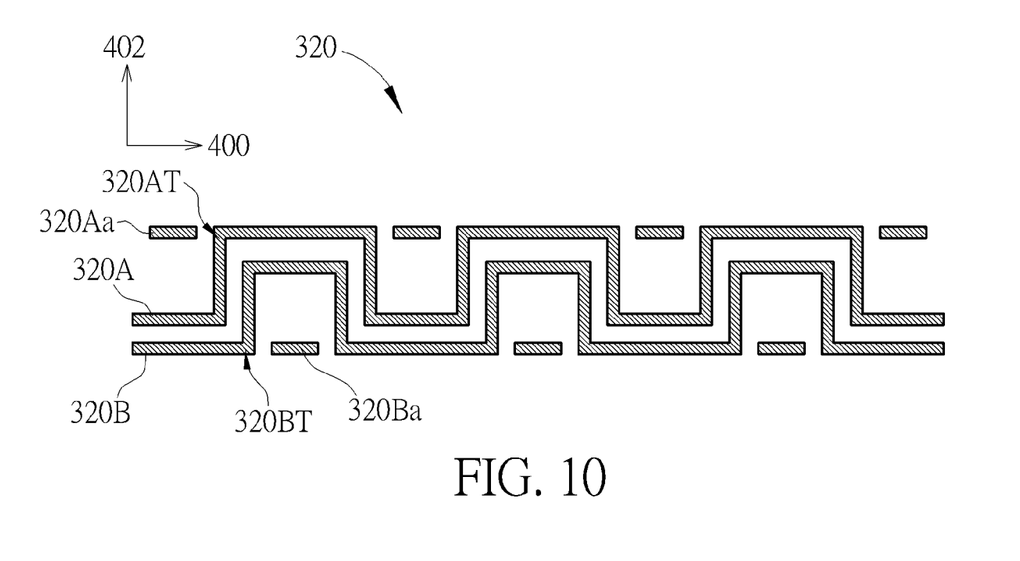
Figure 11:
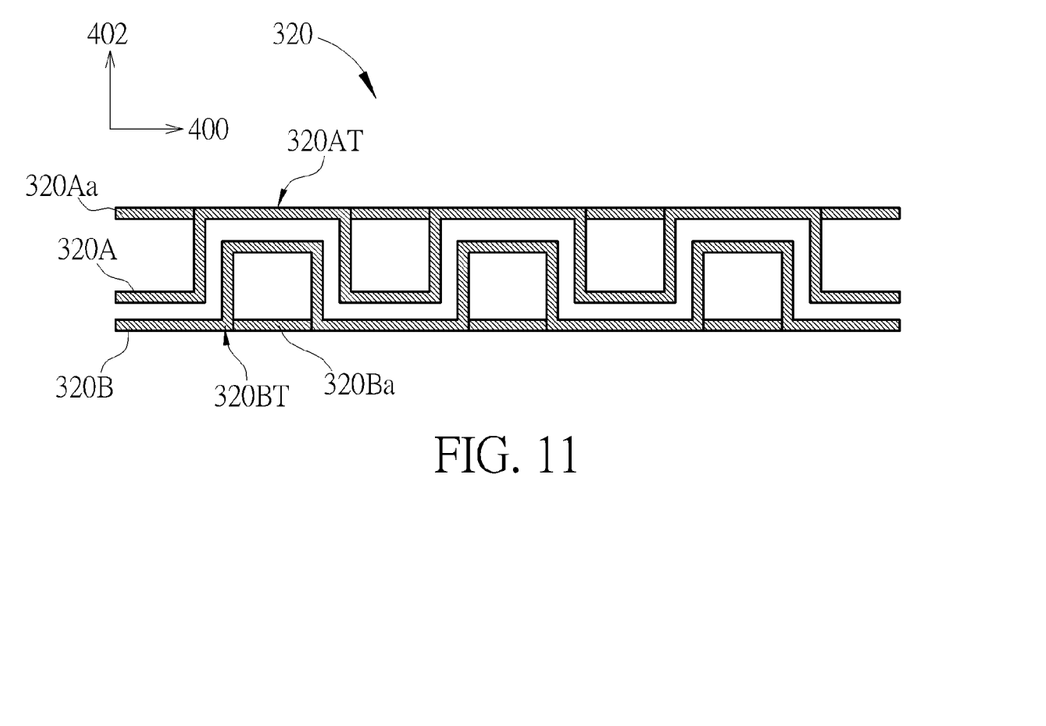

Please see FIG. 10, which shows a schematic diagram of the first layer of the die seal ring according to another embodiment of the present invention. As shown in FIG. 10, the first layer 320 has a first fin ring structure 320A and a second fin ring structure 320B. The first fin ring structure 320A has similar embodiment with that in FIG. 4, and the second fin ring structure 320B is conformal to the first fin ring structure 320A. In this embodiment, a plurality of auxiliary rims can be disposed between each two adjacent turning points. For example, a first auxiliary rim 320Aa is disposed between each two turning points 320AT, and a second auxiliary rim 320Ba is disposed between each two turning points 320BT. Preferably, both the first auxiliary rim 320Aa and the second auxiliary rim 320Bb extend along the first direction 400. In the present embodiment, both the first auxiliary rim 320Aa and the second auxiliary rim 320Bb do not directly contact the turning points 320AT and the turning points 320BT. In another embodiment, as shown in FIG. 11, the first auxiliary rim 320Aa directly contacts the turning points 320AT, and the second auxiliary rim 320Ba directly contacts the turning points 320BT.

Figure 12:
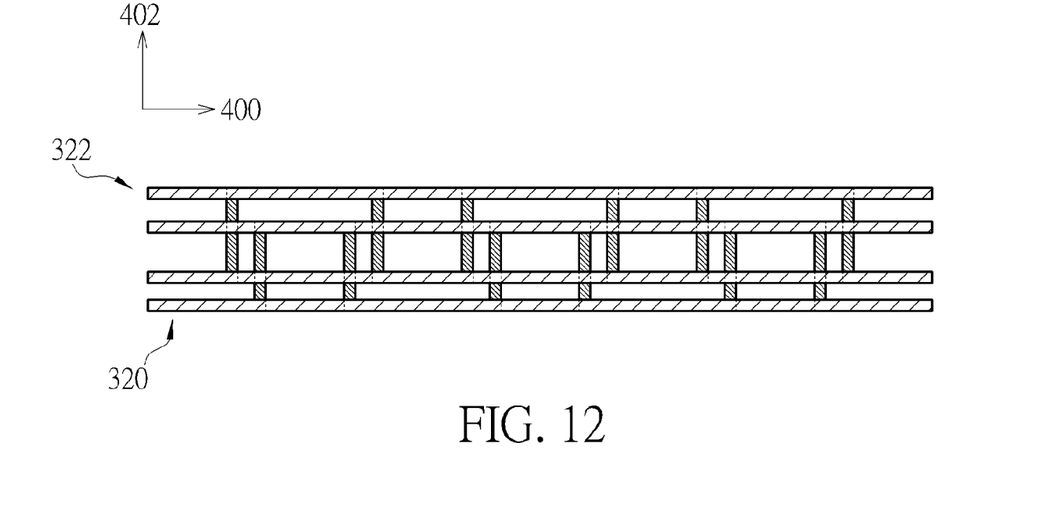

Please see FIG. 12, which shows a schematic diagram of the first layer and the second layer according to another embodiment of the present invention. As shown in FIG. 12 in conjunction with FIG. 3, the second layer 322 is disposed above the first layer 320. The layout of the first layer 320 can be any embodiments mentioned above. The layout of the second layer 322 can be the same or different form that of the first layer 320. For example, the second layer 322 can have one or a plurality of lines which are extending along the first direction 400. Preferably, there should be overlapping points or regions between the layout of the first layer 320 and the layout of the second layer 322.

Figure 13:
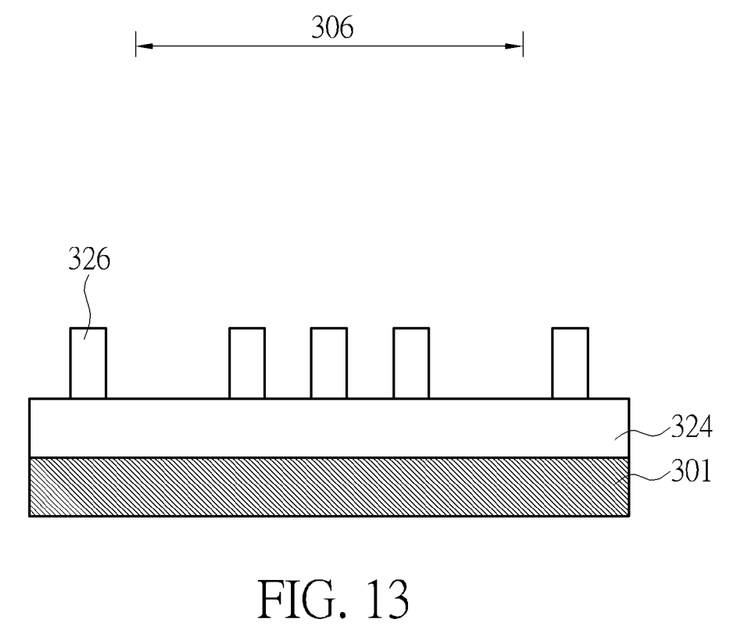
FIG. 13 to FIG. 17 show schematic diagrams of method of forming the die seal ring according to one embodiment of the present invention.

Preferably, the first layer 320 of the die seal ring 308 is formed simultaneously with the fin structure 315 of Fin-FET 314 in the active region 306. More specifically, the first layer 320 and the fin structure 315 are formed by using a "sidewall image transfer (SIT)" process. Please see FIG. 13 to FIG. 17, which show schematic diagrams of method of forming the die seal ring according to one embodiment of the present invention. As shown in FIG. 13, a substrate 301 is provided, such as a silicon substrate, an epitaxial silicon substrate, a silicon germanium substrate, a silicon carbide substrate or a silicon-on-insulator (SOI) substrate. A mask layer 324 is then formed on the substrate 301. In one embodiment, the mask layer 324 can be of a single layer or a multi-layer that can be used as a hard mask. For example, the mask layer 324 can include silicon nitride (SiN), silicon oxynitride (SiON), metal or an advanced pattern film (APF) provided by Applied Material. In another embodiment, the mask layer 324 can include a $SiO_2$/SiN/$SiO_2$ tri-layered structure. Next, a sacrificial layer 326 with a pattern is formed on the mask layer 324. For example, a poly-silicon or an amorphous silicon layer is formed comprehensively on the mask layer 324. A photolithography etching process (PEP) is then carried out to form the sacrificial layer 326 having patterns.

Figure 14:
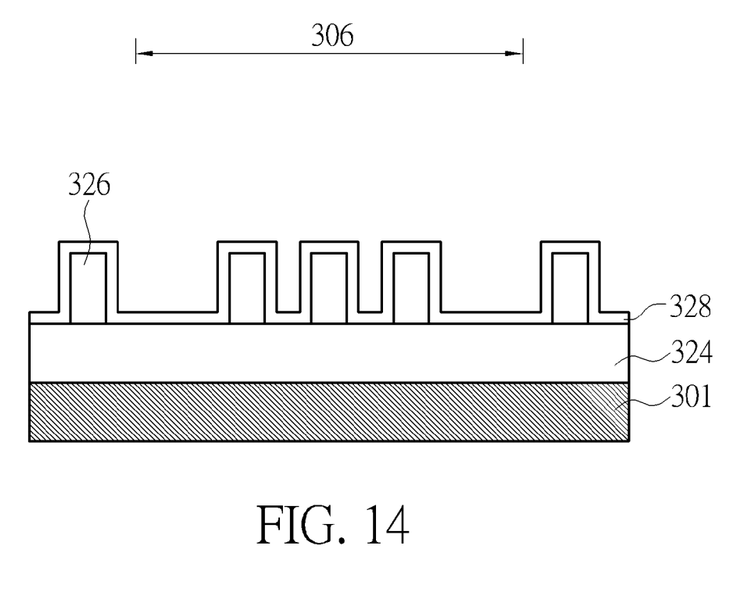
Figure 15:
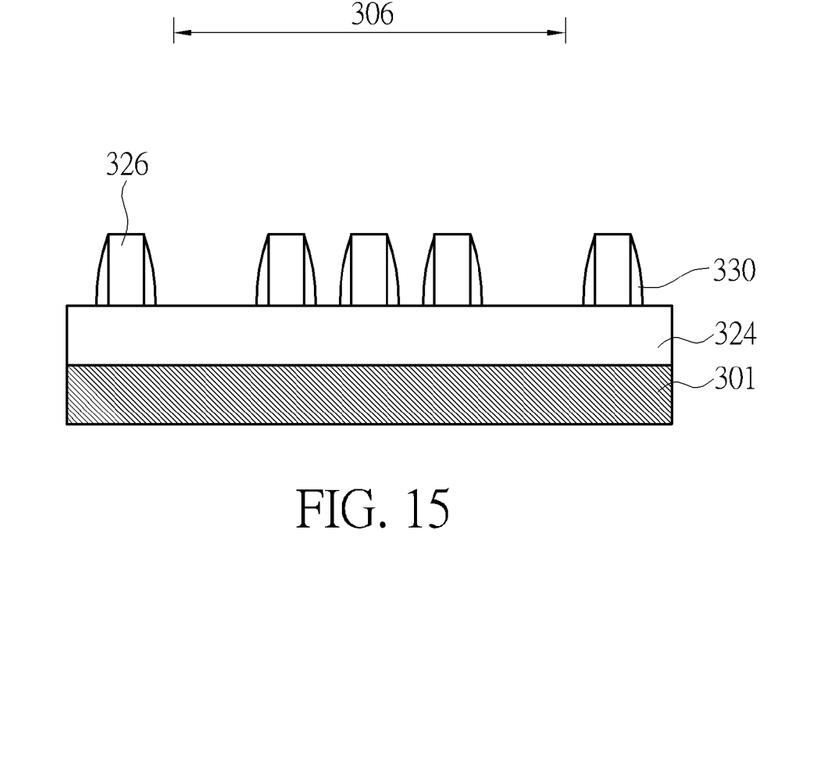
Figure 16:
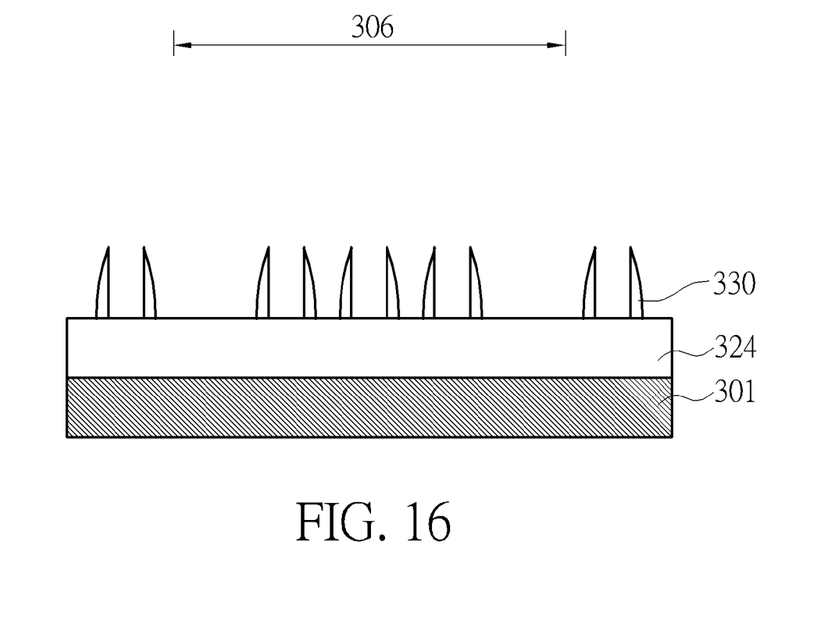

As shown in FIG. 14, a material layer 328, such as a silicon nitride (SiN) layer, is formed conformally on the sacrificial layer 326. The method of forming the material layer 328 can include a chemical vapor deposition (CVD) process or an atomic layer deposition (ALD) process. As shown in FIG. 15, the material layer 328 is anisotropically removed until a top surface of the sacrificial layer 326 and the mask layer 324 is exposed. The material layer 328 becomes a spacer 330 on the sidewall of the sacrificial layer 326. Next, as shown in FIG. 16, the sacrificial layer 326 is completely removed, but the spacers 330 still remain on the mask layer 324.

Figure 17:
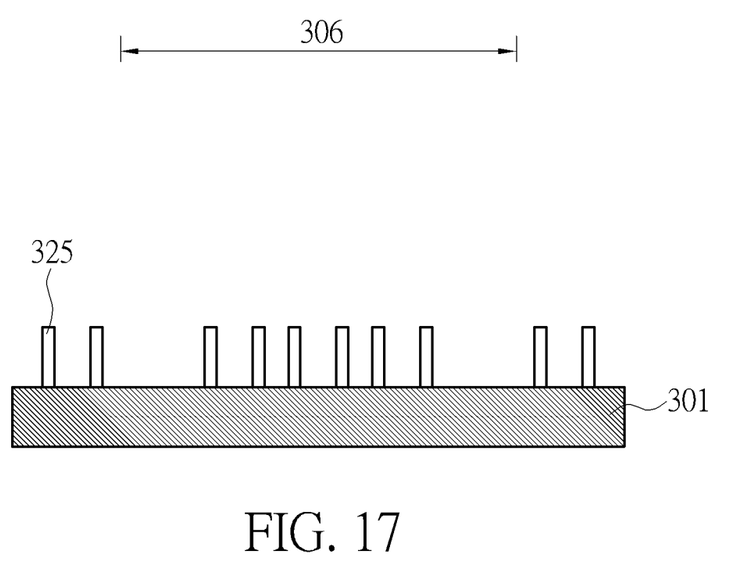

As shown in FIG. 17, an etching process is performed by using the spacer 330 as a mask to pattern the mask layer 324, thereby forming a patterned mask layer 325. In the subsequent step, another etching process is performed by using the patterned mask layer 325 as a mask to pattern the substrate 301, thereby simultaneously forming the fin structures 315 of Fin-FET 314 in the active region 306 and the first layer 320 of the die seal ring 308 that encompasses the active region 306. In the present invention, the layout of the first layer 320 can have any embodiments or their combinations mentioned above. In another embodiment, the mask layer 324 can be omitted. Accordingly, the fin structures 315 and the first layer 320 can be formed directly by etching the substrate 301 by using the spacer 330 as a mask.

Next, a plurality of Fin-FET forming methods can be further carried out to complete the Fin-FET in the active region 306. In one embodiment, the first layer 320 of the die seal ring 308 can be also subjected to the implant process for forming the source/drain region of the Fin-FET 314, thereby making the first layer 320 conductive. Next, a metal interconnection forming method can be carried out to simultaneously forming the second layer 320 and the metal interconnection system 318. By making the first layer 320 conductive and electrically connect to the second layer, the die seal ring 308 in one embodiment can have the EMI reducing ability.

According to the forming method, it is understood that the material of the first layer 320 is the same as that of the fin structure 315, for example, both of them are formed of semiconductor material such as silicon or germanium. In addition, when the first layer 320 is formed by the SIT process and, the layout of the first layer 320 may have a "double ring" structure, as shown in FIG. 8, which shows the first fin ring structure 320A and the second fin ring structure 320B can be formed by the SIT process so they are conformal to each other. By using the SIT process, the first layer 320 may have multi-numbers of fin ring structures, each of which is conformal to each other. However, it is noted that the first layer 320 can be formed by other manufacturing methods and is not limited thereto.

In summary, the present invention provides a die seal ring and a method of forming the same. The die seal ring includes a first ring structure in which the layout of thereof has a stamp like structure. In this way, the long and thin die seal ring can be more rigid and give a strong protection against stress caused crack, break or peeling during process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A die seal ring, comprising:
   a substrate; and
   a first layer in contact with and extruding from an uppermost surface of the substrate, wherein the first layer has a first fin ring structure and a layout of the first fin ring structure has a stamp-like shape, wherein the first layer comprises a same semiconductor material as the substrate.

2. The die seal ring according to claim 1, wherein the first layer has a multi-number of fin ring structures, and a layout of each of the fin ring structures has a stamp-like shape.

3. The die seal ring according to claim 1, wherein the first fin ring structure comprises at least a saw-tooth fin rim.

4. The die seal ring according to claim 1, wherein the first fin ring structure comprises at least a serpent fin rim.

5. The die seal ring according to claim 1, wherein the first fin ring structure has at least a zigzag fin rim.

6. The die seal ring according to claim 1, wherein the first layer further comprises a second fin ring structure, wherein a layout of the second fin ring structure is substantially conformal to that of the first fin ring structure.

7. The die seal ring according to claim 6, wherein the first fin ring structure comprises a plurality of first turning points, and the second fin ring structure has a plurality of second turning points, wherein each first turning point corresponds to each second turning point.

8. The die seal ring according to claim 7, wherein the first fin ring structure comprises a first auxiliary rim disposed between each two adjacent first turning points, and the second fin ring structure comprises a second auxiliary rim disposed between each two adjacent second turning points.

9. The die seal ring according to claim 8, wherein each first auxiliary rim directly contacts each two adjacent first turning points, and each second auxiliary rim directly contacts each two adjacent second turning points.

10. The die seal ring according to claim 8, wherein each first auxiliary rim does not contact each two adjacent first turning points, and each second auxiliary rim does not contact each two adjacent second turning points.

11. The die seal ring according to claim 6, wherein the first layer further comprises:
    a third fin ring structure; and
    a fourth fin ring structure, wherein a layout of the third fin ring structure is substantially conformal to that of the fourth fin ring structure, and the first fin ring structure, the second fin ring structure are symmetric with the third fin ring structure and the fourth fin ring structure.

12. The die seal ring according to claim 1, wherein the die seal ring further comprises a second layer disposed above the first layer, wherein a layout of the second layer overlaps the layout of the first ring structure.

13. The die seal ring according to claim 12, wherein the second layer comprises a metal.

14. The die seal ring according to claim 1, wherein the die seal ring is disposed in a chip, and the chip comprises a plurality of active components that are disposed on the substrate and completely encompassed by the die seal ring.

15. A method for forming a die seal ring, comprising:
    providing a substrate having an active region;

forming a patterned sacrificial layer on the substrate;
forming a spacer on sidewalls of the patterned sacrificial layer;
removing the patterned sacrificial layer;
using the spacer as a mask to pattern the substrate, thereby simultaneously forming at least a fin structure of a Fin-FET and a first layer of the die seal ring, wherein the first layer has a fin ring structure.

16. The method for forming a die seal ring according to claim 15, wherein the first layer comprises a semiconductor material.

17. The method for forming a die seal ring according to claim 15, wherein the first layer has a multi-number of fin ring structures, and a layout of each of the fin ring structures has a stamp-like shape.

18. The method for forming a die seal ring according to claim 15, further comprising: simultaneously forming a metal interconnection system in the active region and a second layer of die seal ring.

19. The method for forming a die seal ring according to claim 18, wherein the second layer comprises a metal.

* * * * *